(12) United States Patent
Joo et al.

(10) Patent No.: US 9,751,328 B2
(45) Date of Patent: Sep. 5, 2017

(54) MONITORING APPARATUS AND A PRINTING APPARATUS

(71) Applicant: SAMSUNG DISPLAY CO., LTD., Yongin, Gyeonggi-Do (KR)

(72) Inventors: Sung-Joong Joo, Gyeonggi-Do (KR); You-Min Cha, Gyeonggi-Do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 408 days.

(21) Appl. No.: 14/107,503

(22) Filed: Dec. 16, 2013

(65) Prior Publication Data

US 2014/0345524 A1   Nov. 27, 2014

(30) Foreign Application Priority Data

May 27, 2013 (KR) ........................ 10-2013-0059794

(51) Int. Cl.
| | | |
|---|---|---|
| B05C 11/10 | (2006.01) | |
| B41J 2/21 | (2006.01) | |
| H01L 51/00 | (2006.01) | |

(52) U.S. Cl.
CPC ........... B41J 2/2142 (2013.01); B05C 11/101 (2013.01); H01L 51/0005 (2013.01)

(58) Field of Classification Search
None
See application file for complete search history.

(56) References Cited

U.S. PATENT DOCUMENTS

| | | | | | |
|---|---|---|---|---|---|
| 1,042,097 | A | * | 10/1912 | Englebright | G01F 1/52 405/87 |
| 3,643,704 | A | * | 2/1972 | Carr | B65B 3/06 141/106 |
| 4,202,398 | A | * | 5/1980 | Osugi | B22D 11/185 164/151.3 |
| 4,766,930 | A | * | 8/1988 | Patti | F16K 15/026 137/540 |
| 6,026,837 | A | * | 2/2000 | Chen | G05D 9/12 137/2 |
| 6,098,029 | A | * | 8/2000 | Takagi | G01F 23/292 382/100 |
| 2003/0222927 | A1 | * | 12/2003 | Koyama | B29D 11/00009 347/2 |
| 2005/0203330 | A1 | * | 9/2005 | Muto | G21F 5/06 600/1 |
| 2009/0007643 | A1 | * | 1/2009 | Svensson | B01D 15/206 73/61.53 |
| 2009/0015632 | A1 | * | 1/2009 | Suzuki | B41J 2/1721 347/36 |

FOREIGN PATENT DOCUMENTS

| | | |
|---|---|---|
| JP | 2004061333 | 2/2004 |
| JP | 2010175380 | 8/2010 |
| KR | 1020060077632 | 7/2006 |
| KR | 1020110110275 | 10/2011 |

* cited by examiner

*Primary Examiner* — Charles Capozzi
(74) *Attorney, Agent, or Firm* — F. Chau & Associates, LLC

(57) ABSTRACT

A monitoring apparatus is provided to monitor an amount of a liquid discharged from a nozzle. The monitoring apparatus includes a discharge case. The discharge case is configured to receive liquid discharged from a nozzle. The discharge case includes a storage space for storing the liquid. A photographing unit photographs the level of the liquid stored in the storage space.

14 Claims, 5 Drawing Sheets

# MONITORING APPARATUS AND A PRINTING APPARATUS

CROSS-REFERENCE TO RELATED APPLICATION

This application claims priority under 35 U.S.C. §119 to Korean Patent Application No. 10-2013-0059794 filed in the Korean Intellectual Property Office on May 27, 2013, the disclosure of which is incorporated by reference herein in its entirety.

(a) TECHNICAL FIELD

The present inventive concept relates to a monitoring apparatus and a printing apparatus, and more particularly, to a monitoring apparatus and a printing apparatus capable of monitoring an amount of liquid discharged from a nozzle.

(b) DISCUSSION OF RELATED ART

Display devices display images. An organic light emitting diode (OLED) display is a type of display device.

The OLED display is self-emissive, and no extra backlight is needed, which enables it to be thinner and lighter compared to a liquid crystal display (LCD). In addition, the OLED display exhibits high-quality characteristics, such as low power consumption, high brightness, high response speed, and the like.

Generally, the OLED display includes various transparent organic layers, such as an organic light emitting layer, an insulating layer, and the like.

A method of printing an organic layer on a substrate by discharging a transparent liquid using a nozzle has been used.

However, when the organic layer is printed on the substrate by using the nozzle, the amount of liquid discharged from the nozzle may not be monitored.

SUMMARY

Exemplary embodiments of the present inventive concept may provide a monitoring apparatus and a printing apparatus capable of monitoring the amount of liquid discharged from a nozzle.

Exemplary embodiments of the present inventive concept may provide a monitoring apparatus capable of monitoring an amount of liquid discharged from a nozzle. The monitoring apparatus may include a discharge case, and a photographing unit. The discharge case may be disposed on a discharge route of the liquid discharged from the nozzle. The discharge case may have a storage space for storing the liquid. The photographing unit may photograph a level of the liquid stored in the storage space.

The storage space may have a reverse conical shape.

An upper side of the storage space may be open.

The discharge case may have a shutter located below the storage space to open and close the storage space.

The discharge case may have a transparent window forming the storage space and facing the photographing unit.

The discharge case may have a transparent plate located above the storage space and having a straight line formed thereon.

The liquid may be transparent.

Exemplary embodiments of the present inventive concept may provide a printing apparatus. The printing apparatus may include a nozzle, a discharge case, and a photographing unit. The nozzle may discharge a liquid onto a substrate. The discharge case may be disposed on a discharge route of the liquid discharged from the nozzle. The photographing unit may photograph a level of the liquid stored in the storage space.

The printing apparatus may include a controller connected to the photographing unit and the nozzle. The controlling unit may control a discharge amount of the liquid discharged from the nozzle based on the level of the liquid photographed by the photographing unit.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Exemplary embodiments of the present inventive concept will be described more fully hereinafter with reference to the accompanying drawings. The present inventive concept may be embodied in different forms, and should not be construed as limited to the embodiments set forth herein.

Figure 1:
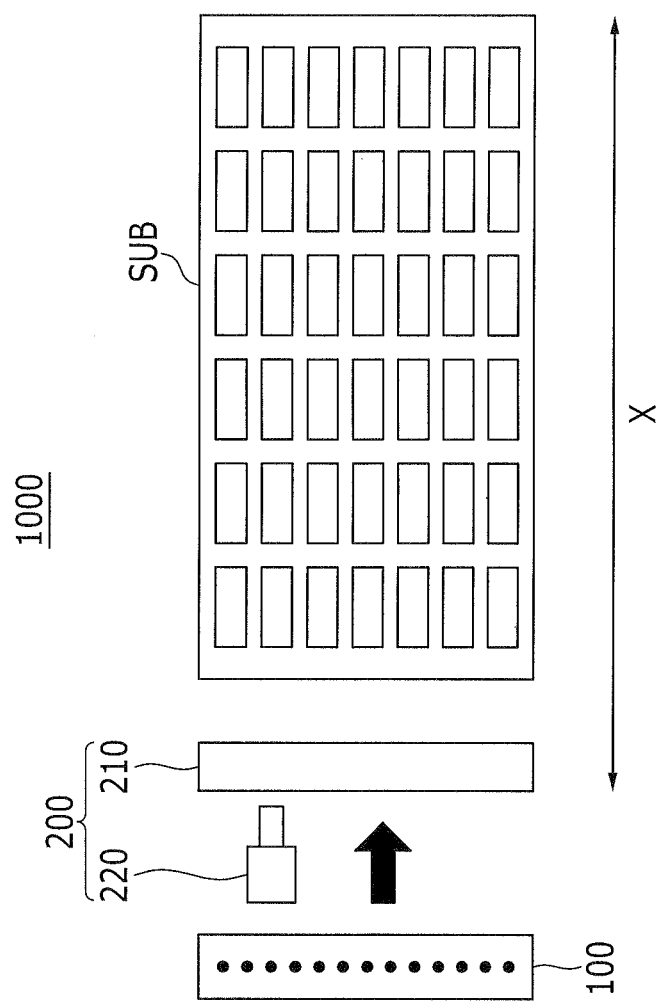
FIG. 1 shows a printing apparatus according to an exemplary embodiment of the present inventive concept, when viewed from the top.
Figure 2:
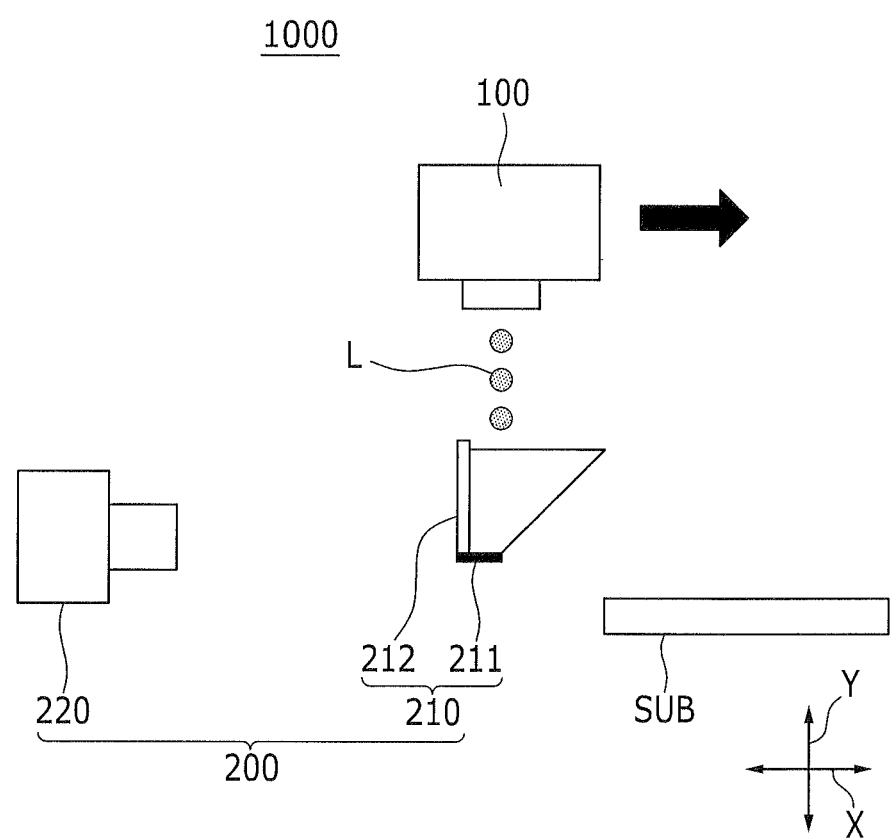
FIG. 2 shows the printing apparatus shown in FIG. 1, when viewed from the side.
Figure 3:
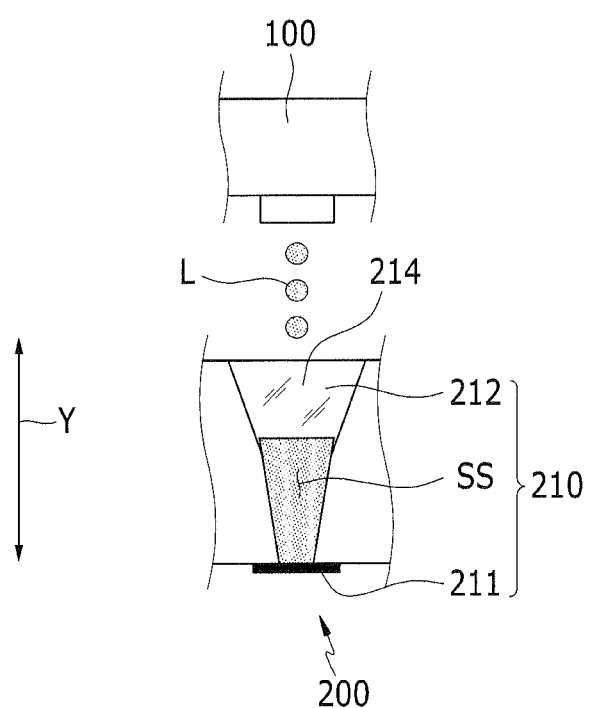
FIG. 3 shows a nozzle and a discharge case shown in FIG. 2, when viewed from a position of a photographing unit.

Referring to FIG. 1 to FIG. 3, a printing apparatus according to an exemplary embodiment of the present inventive concept will be described.

FIG. 1 is a view of a printing apparatus according to an exemplary embodiment of the present inventive concept, when viewed from the top. FIG. 2 shows a printing apparatus shown in FIG. 1, when viewed from the side. FIG. 3 shows a nozzle and a discharge case shown in FIG. 2, when viewed from a position of a photographing unit. For convenience of illustration, FIG. 3 shows only one nozzle and one discharge case among a plurality of nozzles and a plurality of discharge cases disposed in line.

As shown in FIG. 1 to FIG. 3, a printing apparatus 1000 according to an exemplary embodiment of the present inventive concept may be configured to print a liquid L on a substrate SUB. The liquid L may be transparent. The liquid L may form an organic layer on the substrate SUB. The printing apparatus 1000 may include a nozzle 100 and a monitoring apparatus 200.

The nozzle 100 may discharge the liquid L in a direction (Y). The substrate SUB may be disposed in an extending direction (X). The nozzle 100 may move in the extending direction (X) of a surface of the substrate SUB while discharging the liquid L. The liquid L may be used to form an organic layer such as an organic light emitting layer on the substrate SUB.

The monitoring apparatus 200 may monitor the amount of the liquid L discharged from the nozzle 100 in the direction (Y). The monitoring apparatus 200 may include a discharge case 210 and a photographing unit 220.

The discharge case 210 may be disposed on a discharge route of the liquid L discharged from the nozzle in the direction (Y). The discharge case 210 may have a storage space SS formed therein. The storage space SS may store the liquid L discharged from the nozzle 100. The storage space SS formed in the discharge case 210 may have a reverse conical shape. The storage space SS of the discharge case 210 may have a reverse conical shape. The level of the liquid L stored in the storage space SS may be monitored when the amount of the liquid L discharged from the nozzle 100 is slight. An upper side 214 of the storage space SS of the discharge case 210 may be open. The liquid L may be dropped from the nozzle 100 through the opened portion and may be stored in the storage space SS of the discharge case 210.

The discharge case 210 may include a shutter 211 and a transparent window 212.

The shutter 211 may be disposed below the storage space SS of the discharge case 210, and may open and close the storage space SS. The shutter 211 may be disposed below the storage space SS and opened so that the liquid L stored in the storage space SS may be discharged from the storage space SS or closed so that the liquid L discharged from the nozzle 100 may be stored in the storage space SS. By using the shutter 211, the liquid L stored in the storage space SS can be discharged from the storage space SS and the liquid L discharged from the nozzle 100 can be stored in the storage space SS.

The transparent window 212 may form one or more sides of the storage space SS, and may face the photographing unit 220. The transparent window 212 may be transparent, which may allow the photographing unit 220 to monitor the level of the liquid L stored in the storage space SS.

The photographing unit 220 may be adjacent to the discharge case 210. The photographing unit 220 may photograph the level of the liquid L stored in the storage space SS. The photographing unit 220 may include a charge-coupled device (CCD) camera. The level of the liquid L stored in the storage space SS, which is photographed by the photographing unit 220, may be provided to a user as an image. The photographing unit 220 may monitor the liquid L, which is dropped into the discharge case 210, through a transparent plate 213 (shown in FIG. 4). The photographing unit 220 may photograph the liquid L discharged from the nozzle 100 as it fills the storage space SS in real time, so that a user can accurately analyze the volume of the liquid L according to, for example, the number of drops of the liquid L discharged from the nozzle 100. This way, the user may accurately monitor the discharge amount of the liquid L discharged from the nozzle 100.

As can be seen, the printing apparatus 1000 according to an exemplary embodiment of the present inventive concept can monitor the amount of the liquid L discharged from the nozzle 100 in real time by using the monitoring apparatus 200.

For example, the printing apparatus 1000 according to an exemplary embodiment of the present inventive concept does not have to monitor the amount of the liquid L discharged from the nozzle 100 to the substrate SUB, rather the printing apparatus 1000 may photograph the level of the liquid L stored in the storage space SS of the discharge case 210 to monitor the amount of the liquid L discharged from the nozzle 100. Thus, the amount of the liquid L discharged from the nozzle 100 can be monitored by using the water level of the liquid L stored in the storage space SS even though the liquid L is transparent.

Further, by storing the liquid L in the storage space SS as it is discharged from the nozzle 100, the amount of the liquid L discharged from the nozzle 100 can be monitored in real time.

Further, the ability of the shutter 211 to open or close to thereby remove the contents of the discharge case 210 and allow another amount of liquid L to fill the discharge case 210, permits efficient monitoring. A monitoring apparatus according to an exemplary embodiment of the present inventive concept will be described with reference to FIG. 4.

Parts similar to those shown in FIGS. 1 to 3 may not be again described in an effort to avoid repetition.

Figure 4:
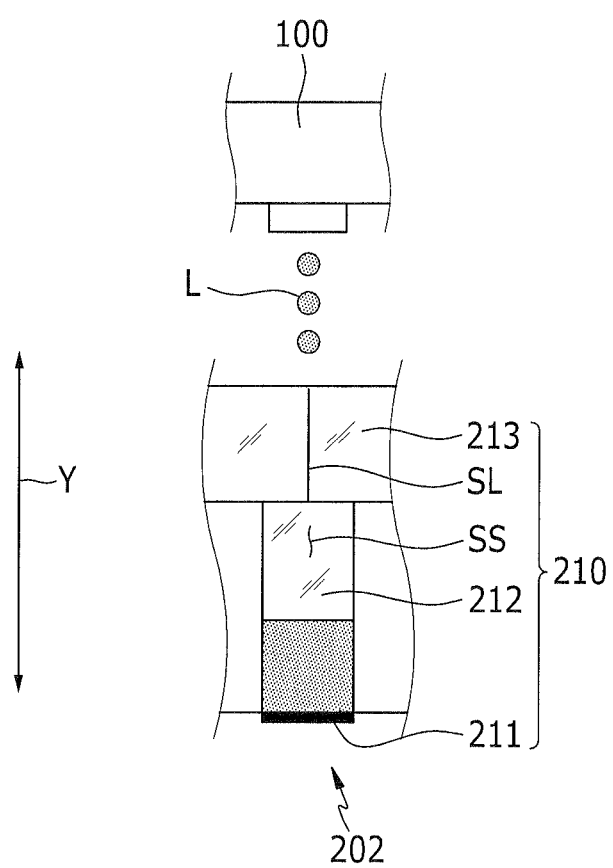
FIG. 4 shows a monitoring apparatus according to an exemplary embodiment of the present inventive concept.

FIG. 4 shows a monitoring apparatus according to an exemplary embodiment of the present inventive concept. FIG. 4 shows a nozzle 100 and a discharge case 210 of the monitoring apparatus according to the present exemplary embodiment, when viewed from a position of a photographing unit. For example, the photographing unit 220 of FIG. 2. For convenience of illustration, FIG. 4 shows only one nozzle and one discharging case among a plurality of nozzles and a plurality of discharge cases, which may be disposed in line.

As shown in FIG. 4, a storage space SS of the discharge case 210 of the monitoring apparatus 202 according to the present exemplary embodiment may have a cylindrical shape. The discharge case 210 may include a shutter 211, a transparent window 212, and a transparent plate 213.

The transparent plate 213 may be disposed above the storage space SS. The transparent plate 213 may be formed integrally with the transparent window 212. The transparent plate 213 may be formed of a different material from the material forming the transparent window 212. The transparent plate 213 may have a straight line SL formed thereon. The straight line may extend in a direction (Y).

The monitoring apparatus 202 according to the present exemplary embodiment may include the transparent plate 213, which may be disposed above the storage space SS of the discharge case 210. The transparent plate 213 may have the straight line SL formed thereon. The straight line SL may extend in the direction (Y). This way, the degree of deviation of the liquid L discharged from the nozzle 100 can be monitored by using the straight line SL formed on the transparent plate 213 and the photographing unit 220. In other words, the monitoring apparatus 202 may be capable of monitoring the straightness of the liquid L discharged from the nozzle 100.

Figure 5:
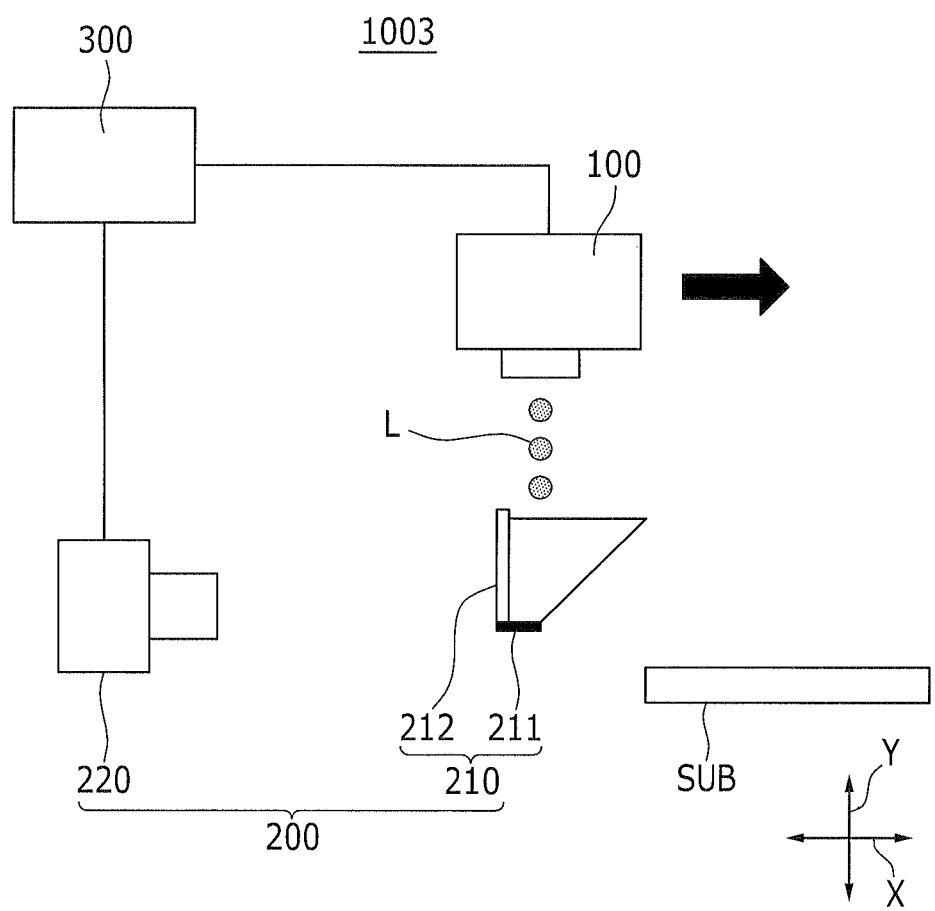
FIG. 5 shows a printing apparatus according to an exemplary embodiment of the present inventive concept.

Hereinafter, a printing apparatus according to an exemplary embodiment of the present inventive concept will be described with reference to FIG. 5. Parts similar to those shown in FIGS. 1 to 4 may not be again described in an effort to avoid repetition. FIG. 5 shows a printing apparatus according to an exemplary embodiment of the present inventive concept, when viewed from the side.

As shown in FIG. 5, a printing apparatus 1003 may be configured to print a transparent liquid L on a substrate SUB to form an organic layer on the substrate SUB. The printing apparatus 1003 may include a nozzle 100, a monitoring apparatus 200, and a controller 300.

The controller 300 may be connected to a photographing unit 220 and the nozzle 100. The controller 300 may control the amount of liquid L discharged from the nozzle 100. The amount of liquid L discharged may be based on the level of the liquid L already discharged from the nozzle 100 and stored in a storage space SS. The level of the liquid L may be photographed by the photographing unit 220.

The controller 300 may monitor the amount of liquid L discharged from the nozzle 100. For example, the nozzle 100 may move in an extending direction (X) along a surface of the substrate SUB. The controller 300 may monitor the amount of liquid L discharged from the nozzle 100 by using the photographing unit 220 at a first point along the X direction. Then, under control of the controller 300, the nozzle 100 may be moved in the extending direction (X) along the surface of the substrate SUB to a second point, and based on the amount of the liquid L that had been discharged at the first point, the amount of the liquid L discharged at the second point is determined.

For example, when the amount of the liquid L discharged from the nozzle 100 when the nozzle 100 first moves is large, the controller 300 may receive feedback to reduce the amount of the liquid L to be discharged from the nozzle 100 the next time it moves.

As can be seen, the printing apparatus 1003 according to an exemplary embodiment of the present inventive concept may control the amount of the liquid L discharged from the nozzle 100 based on the level of the liquid L photographed by the photographing unit 220 by using the controller 300. Thus, the amount of the liquid L discharged from the nozzle 100 may be monitored in real time and accordingly controlled so that a printing process can be effectively carried out.

While the present inventive concept has been shown and described with reference to the exemplary embodiments thereof, it will be apparent to those of ordinary skill in the art that various changes in form and detail may be made thereto without departing from the spirit and scope of the inventive concept as defined by the claims.

What is claimed is:

1. A monitoring apparatus, comprising:
a discharge case configured to receive a liquid discharged from a nozzle, the discharge case having a storage space configured to store the liquid, wherein the discharge case is disposed in a free falling path of the liquid discharged from the nozzle, wherein the discharge case comprises a transparent plate disposed above the storage space, wherein the transparent plate includes a vertical straight line formed thereon, and wherein the vertical straight line is disposed along a side of the free falling path of the discharged liquid; and
a photographing unit comprising a camera, wherein the camera is configured to photograph a level of the liquid stored in the storage space.

2. The monitoring apparatus of claim 1, wherein the storage space has a reverse conical shape.

3. The monitoring apparatus of claim 1, wherein an upper side of the storage space is open.

4. The monitoring apparatus of claim 3, wherein the discharge case comprises a shutter disposed below the storage space to open and close the storage space.

5. The monitoring apparatus of claim 4, wherein the discharge case comprises a transparent window facing the photographing unit.

6. The monitoring apparatus of claim 1, wherein the liquid is transparent.

7. A printing apparatus, comprising:
a nozzle configured to discharge a liquid in a first direction onto a substrate, wherein the nozzle is configured to move in a second direction along a surface of the substrate;

a discharge case configured to receive the liquid discharged from the nozzle, the discharge case having a storage space configured to store the liquid, wherein the discharge case is disposed between the nozzle and the substrate in the first direction, wherein the discharge case comprises a transparent plate disposed above the storage space, wherein the transparent plate includes a vertical straight line formed thereon, and wherein the vertical straight line is disposed along a side of the free falling path of the discharged liquid; and a photographing unit adjacent to the discharge case, the photographing unit comprising a camera configured to photograph a level of the liquid stored in the storage space.

8. The printing apparatus of claim 7, further comprising a controller connected to the photographing unit and the nozzle, the controller configured to control an amount of the liquid discharged from the nozzle based on the level of the liquid photographed by the photographing unit.

9. The printing apparatus of claim 7, wherein the discharge case comprises a shutter disposed below the storage space, the shutter configured to empty the liquid from the storage space; and
a window disposed on a side of the storage space, the window configured to allow the photographing unit to photograph the level of the liquid stored in the storage space.

10. The printing apparatus of claim 7, wherein the liquid is transparent.

11. A monitoring apparatus, comprising:
a discharge case configured to receive and store a liquid discharged from a nozzle, the discharge case having a storage space configured to store the liquid, wherein the discharge case is disposed in a free falling path of the liquid discharged from the nozzle, wherein the discharge case comprises a transparent plate disposed above the storage space, wherein the transparent plate includes a vertical straight line formed thereon, wherein the vertical straight line is positioned along an axis of the free falling path of the discharged liquid, and wherein the vertical straight line is dimensioned and positioned to monitor a path of the liquid discharged from the nozzle to the storage space; and
a photographing unit comprising a camera configured to photograph a level of the discharged liquid, wherein the liquid is visible through a window formed at a side of the discharge case.

12. The monitoring apparatus of claim 11, wherein the liquid is transparent.

13. The monitoring apparatus of claim 11, wherein the discharge case comprises a shutter disposed below the storage space, the shutter configured to empty the liquid from the storage space.

14. The monitoring apparatus of claim 11, further comprising a controller configured to base a current amount of the liquid discharged from the nozzle on a prior amount of the liquid discharged from the nozzle.

* * * * *